United States Patent
Chang et al.

(10) Patent No.: US 12,007,435 B2
(45) Date of Patent: Jun. 11, 2024

(54) METHOD OF COPPER HILLOCK DETECTING

(71) Applicant: UNITED MICROELECTRONICS CORP., Hsin-Chu (TW)

(72) Inventors: Ching-Chih Chang, Tainan (TW);
Yi-Hsiu Chen, Pingtung County (TW);
Yuan-Fu Ko, Tainan (TW);
Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 775 days.

(21) Appl. No.: 17/114,515

(22) Filed: Dec. 8, 2020

(65) Prior Publication Data
US 2022/0178992 A1     Jun. 9, 2022

(51) Int. Cl.
*G01R 31/28*     (2006.01)
(52) U.S. Cl.
CPC ..... *G01R 31/2884* (2013.01); *G01R 31/2894* (2013.01); *Y10T 29/49004* (2015.01)
(58) Field of Classification Search
CPC ............ G01R 31/2884; G01R 31/2894; Y10T 29/49004

USPC .............................. 29/593, 407.01, 825, 829
See application file for complete search history.

(56) References Cited

U.S. PATENT DOCUMENTS

| | | | |
|---|---|---|---|
| 7,515,258 B2 * | 4/2009 | Ohminami | ........ H01L 21/76829 356/237.4 |
| 8,323,990 B2 | 12/2012 | Shi | |
| 9,881,844 B2 * | 1/2018 | Yi | ........................... H01L 22/34 |

OTHER PUBLICATIONS

Lee, "A New Stress Migration Failure Mode in Highly Scaled Cu/Low-k Interconnects", Jun. 2012.

* cited by examiner

*Primary Examiner* — Thiem D Phan
(74) *Attorney, Agent, or Firm* — Winston Hsu

(57) ABSTRACT

A method of copper hillock detecting includes the following steps. A testkey structure is disposed on a substrate, wherein the testkey structure includes a lower metallization layer, an upper metallization layer, and a dielectric layer between the lower metallization layer and the upper metallization layer. A force voltage difference is applied to the lower metallization layer and the upper metallization layer under a test temperature and stress time. A changed sensing voltage difference to the lower metallization layer and the upper metallization layer is detected for detecting copper hillock.

15 Claims, 7 Drawing Sheets

1(a)

1(b)

1(a)

1(b)

3(a)

3(b)

METHOD OF COPPER HILLOCK DETECTING

BACKGROUND OF THE INVENTION

1. Field of the Invention

The present invention relates generally to a method of copper hillock detecting, and more specifically to a method of copper hillock detecting applying testkey structures.

2. Description of the Prior Art

In the production process of integrated circuits, devices are tested to estimate the device yields and possible yield detracting processing problems. Since the production of integrated circuits includes many processing steps and different technologies, the technological sources of electrical failure such as short circuits within the integrated circuits or open contacts are investigated using test structures in order to estimate a suitable process window and to improve the device quality as well as the processing yield. It is known that copper hillocks may confuse defect inspection tools so that other defects cannot be detected accurately. The detection of copper hillocks is thus desirable to better monitor the performance of the production process and to provide a better estimate of a suitable process window.

SUMMARY OF THE INVENTION

The present invention provides a method of copper hillock detecting, which applies a force voltage difference to a lower metallization layer and an upper metallization layer under a test temperature and stress time for detecting copper hillock.

The present invention provides a method of copper hillock detecting including the following steps. A testkey structure is disposed on a substrate, wherein the testkey structure includes a lower metallization layer, an upper metallization layer, and a dielectric layer between the lower metallization layer and the upper metallization layer. A force voltage difference is applied to the lower metallization layer and the upper metallization layer under a test temperature and stress time. A changed sensing voltage difference to the lower metallization layer and the upper metallization layer is detected for detecting copper hillock.

According to the above, the present invention provides a method of copper hillock detecting, which disposes a testkey structure including a lower metallization layer, an upper metallization layer, and a dielectric layer between the lower metallization layer and the upper metallization layer on a substrate, applies a force voltage difference to the lower metallization layer and the upper metallization layer under a test temperature and stress time, and detects a changed sensing voltage difference to the lower metallization layer and the upper metallization layer for detecting copper hillock between the lower metallization layer and the upper metallization layer, or between metal lines of the lower metallization layer or between metal lines of the upper metallization layer.

These and other objectives of the present invention will no doubt become obvious to those of ordinary skill in the art after reading the following detailed description of the preferred embodiment that is illustrated in the various figures and drawings.

DETAILED DESCRIPTION

Figure 8:
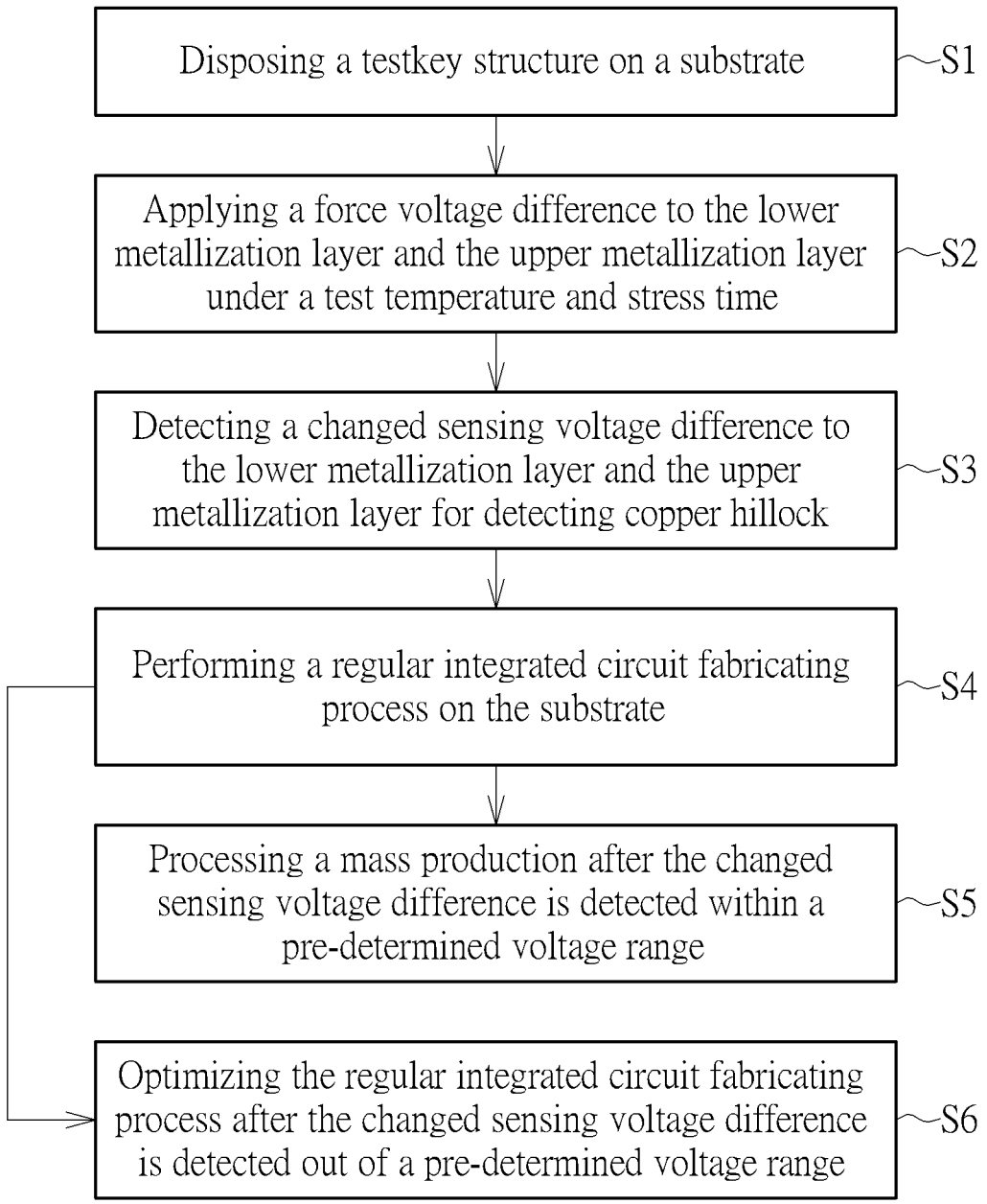
FIG. 8 schematically depicts a flow chart of a method of copper hillock detecting according to an embodiment of the present invention.

FIG. 8 schematically depicts a flow chart of a method of copper hillock detecting according to an embodiment of the present invention. According to step S1 of FIG. 8—disposing a testkey structure on a substrate, testkey structures are applied in the present invention for copper hillock detecting. Four testkey structures are depicted in FIGS. 1-4 as examples, but the present invention is not restricted thereto.

Figure 1:
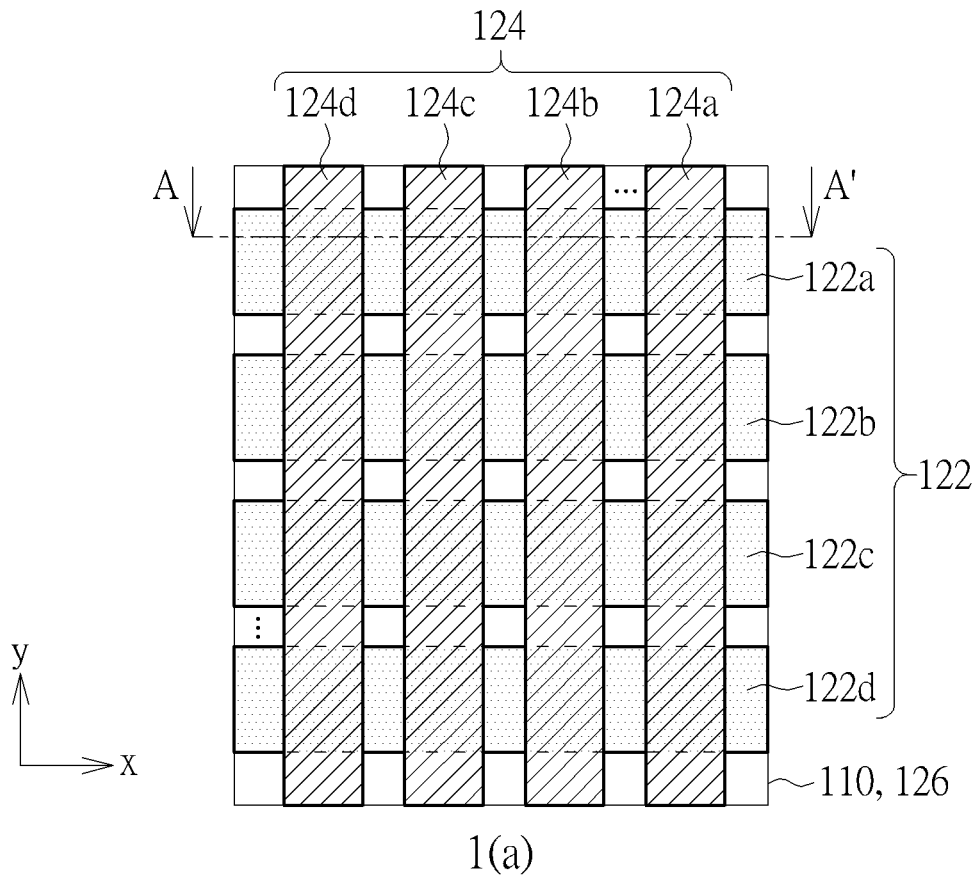
FIG. 1 schematically depicts a top view and a cross-sectional view of a testkey structure according to an embodiment of the present invention.
Figure 1:
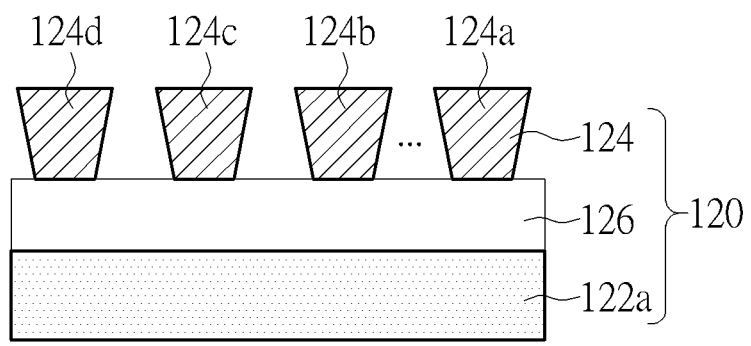

FIG. 1 schematically depicts a top view and a cross-sectional view of a testkey structure according to an embodiment of the present invention, wherein FIG. 1 (a) depicts a top view of a testkey structure, and FIG. 1 (b) depicts a cross-sectional view of the testkey structure along line AA'. A testkey structure 120 is disposed on a substrate 110, wherein the testkey structure 120 is disposed in a scribe line of the substrate 110. The substrate 110 may have formed thereon any type or number of integrated circuit structure such as transistors, resistors, and the like. The testkey structure 120 is not limited by particular integrated circuit structures over which it is formed, or to which metallization layers are logically connected. As such, the integrated circuit structures are not shown in the figures.

In this embodiment, the testkey structure 120 includes a lower metallization layer 122, an upper metallization layer 124, and a dielectric layer 126. The dielectric layer 126 is located between the lower metallization layer 122 and the upper metallization layer 124 for electrically isolating the lower metallization layer 122 from the upper metallization layer 124. In this case, the lower metallization layer 122 includes a plurality of first metal lines 122a/122b/122c/122d parallel to each other, and the upper metallization layer 124 includes a plurality of second metal lines 124a/124b/124c/124d parallel to each other. The first metal lines 122a/122b/122c/122d and the second metal lines 124a/124b/124c/124d are crossly arranged, wherein the first metal lines 122a/122b/122c/122d are disposed along a first direction x while the second metal lines 124a/124b/124c/124d are disposed along a second direction y.

Figure 2:
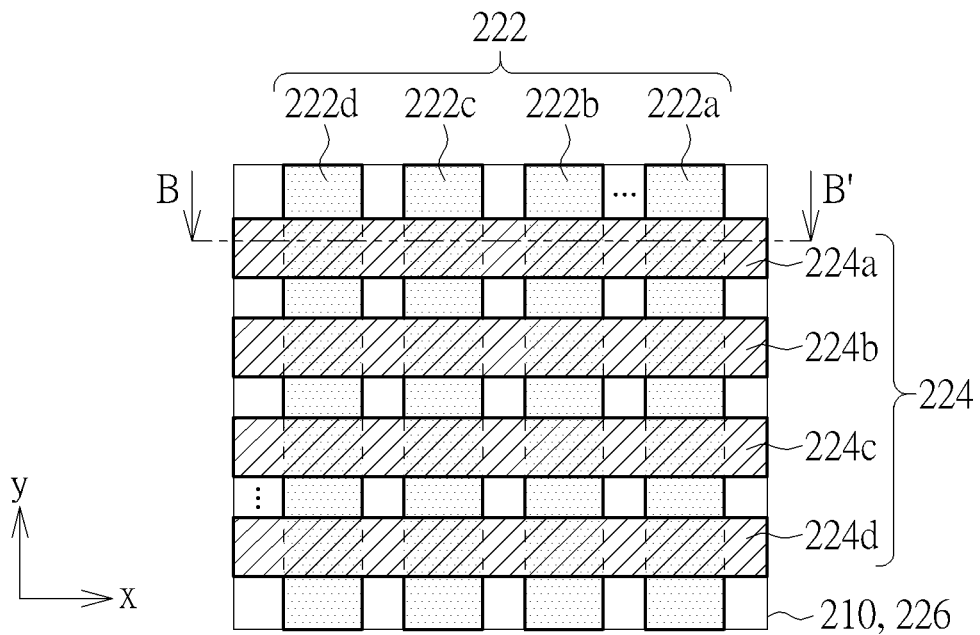
FIG. 2 schematically depicts a top view and a cross-sectional view of a testkey structure according to an embodiment of the present invention.
Figure 2:
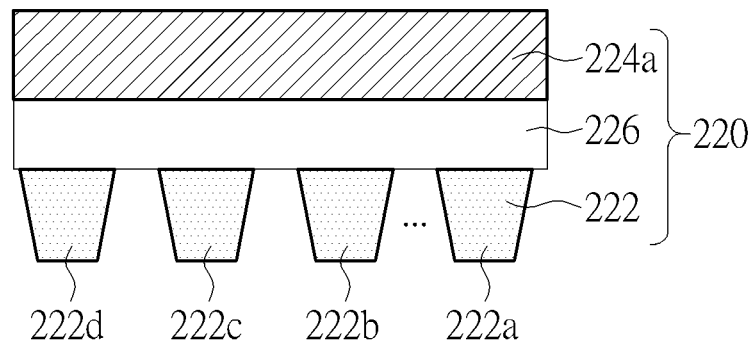

FIG. 2 schematically depicts a top view and a cross-sectional view of a testkey structure according to an embodiment of the present invention, wherein FIG. 2 (a) depicts a top view of a testkey structure, and FIG. 2(b) depicts a cross-sectional view of the testkey structure along line BB'. A testkey structure 220 is disposed on a substrate 210. The substrate 210 may have formed thereon any type or number of integrated circuit structure such as transistors, resistors, and the like. In this embodiment, the testkey structure 220 includes a lower metallization layer 222, an upper metallization layer 224, and a dielectric layer 226. The dielectric layer 226 is located between the lower metallization layer 222 and the upper metallization layer 224 for electrically isolating the lower metallization layer 222 from the upper metallization layer 224. In this case, the lower metallization layer 222 includes a plurality of first metal lines 222a/222b/222c/222d parallel to each other, and the upper metallization layer 224 includes a plurality of second metal lines 224a/224b/224c/224d parallel to each other. The first metal lines 222a/222b/222c/222d and the second metal lines 224a/224b/224c/224d are crossly arranged. In this case, the first metal lines 222a/222b/222c/222d are disposed along the second direction y while the second metal lines 224a/224b/224c/224d are disposed along the first direction x.

Figure 3:
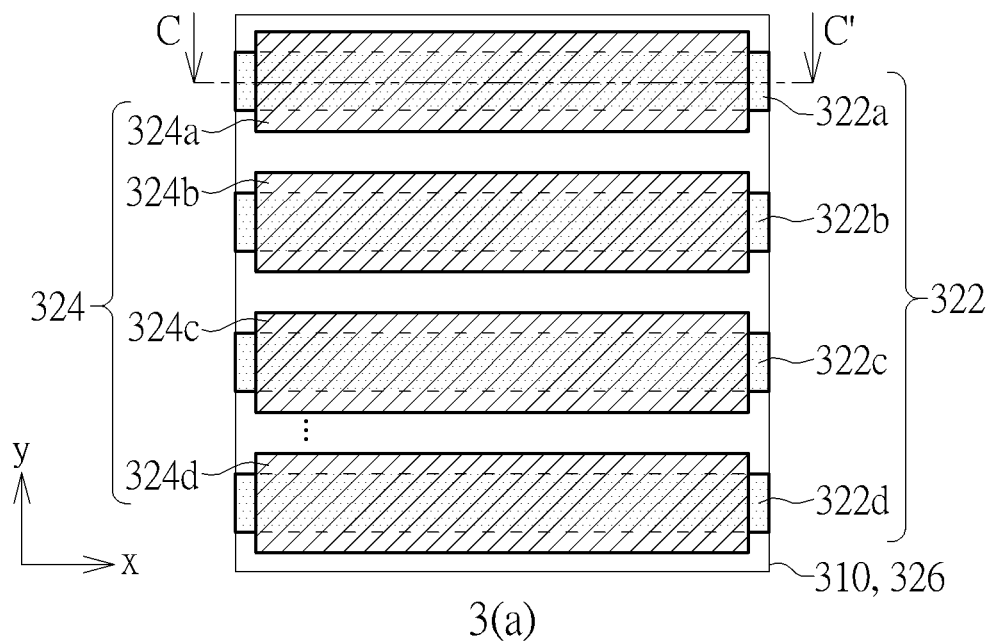
FIG. 3 schematically depicts a top view and a cross-sectional view of a testkey structure according to an embodiment of the present invention.
Figure 3:
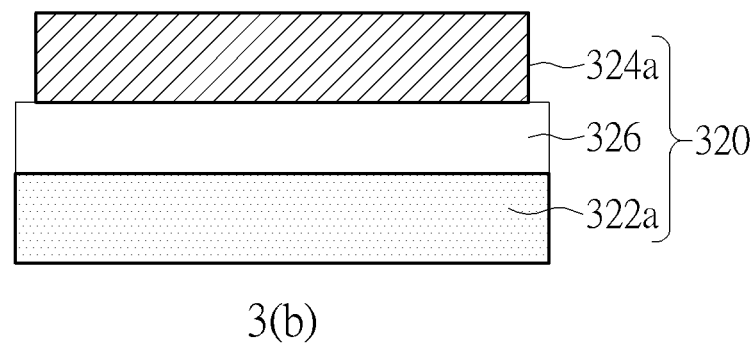

FIG. 3 schematically depicts a top view and a cross-sectional view of a testkey structure according to an embodiment of the present invention, wherein FIG. 3 (a) depicts a top view of a testkey structure, and FIG. 3(b) depicts a cross-sectional view of the testkey structure along line CC'. A testkey structure 320 is disposed on a substrate 310. In this embodiment, the testkey structure 320 includes a lower metallization layer 322, an upper metallization layer 324, and a dielectric layer 326. The dielectric layer 326 is located between the lower metallization layer 322 and the upper metallization layer 324 for electrically isolating the lower metallization layer 322 from the upper metallization layer 324. In this case, the lower metallization layer 322 includes a plurality of first metal lines 322a/322b/322c/322d parallel to each other, and the upper metallization layer 324 includes a plurality of second metal lines 324a/324b/324c/324d parallel to each other. The first metal lines 322a/322b/322c/322d and the second metal lines 324a/324b/324c/324d extend along a same direction. In this case, the first metal lines 322a/322b/322c/322d and the second metal lines 324a/324b/324c/324d are disposed along the first direction x. Besides, the first metal lines 322a/322b/322c/322d overlap the second metal lines 324a/324b/324c/324d completely, but it is not limited thereto.

Figure 4:
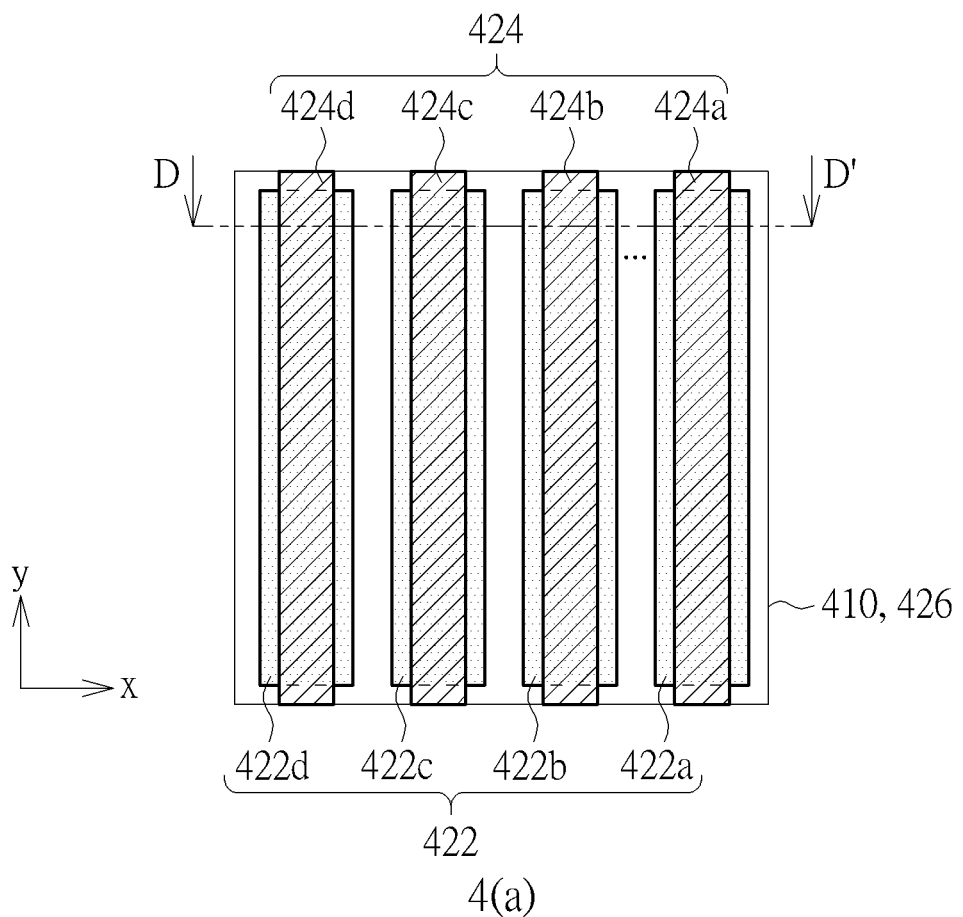
FIG. 4 schematically depicts a top view and a cross-sectional view of a testkey structure according to an embodiment of the present invention.
Figure 4:
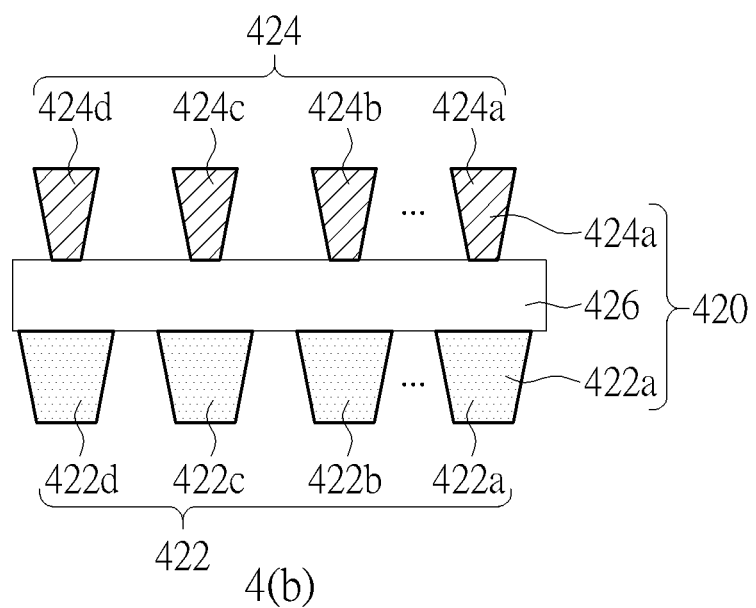

FIG. 4 schematically depicts a top view and a cross-sectional view of a testkey structure according to an embodiment of the present invention, wherein FIG. 4 (a) depicts a top view of a testkey structure, and FIG. 4(b) depicts a cross-sectional view of the testkey structure along line DD'. A testkey structure 420 is disposed on a substrate 410. In this embodiment, the testkey structure 420 includes a lower metallization layer 422, an upper metallization layer 424, and a dielectric layer 426. The dielectric layer 426 is located between the lower metallization layer 422 and the upper metallization layer 424 for electrically isolating the lower metallization layer 422 from the upper metallization layer 424. In this case, the lower metallization layer 422 includes a plurality of first metal lines 422a/422b/422c/422d parallel to each other, and the upper metallization layer 424 includes a plurality of second metal lines 424a/424b/424c/424d parallel to each other. The first metal lines 422a/422b/422c/422d and the second metal lines 424a/424b/424c/424d extend along a same direction. In this case, the first metal lines 422a/422b/422c/422d and the second metal lines 424a/424b/424c/424d are disposed along the second direction y. Besides, the first metal lines 422a/422b/422c/422d vertically overlap the second metal lines 424a/424b/424c/424d completely. In this case, the first metal lines 422a/422b/422c/422d overlap the second metal lines 424a/424b/424c/424d completely.

A structure test for current leakage between metal interconnect layers that may be caused by a hillock-induced electrical short is provided in the present invention.

Figure 5:
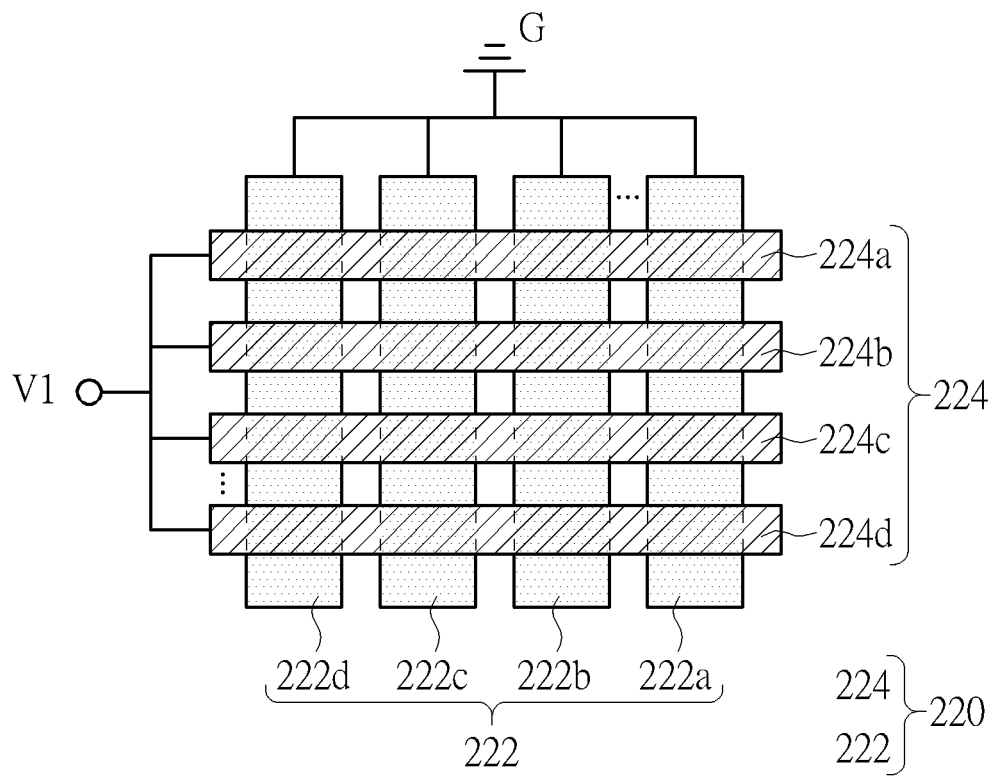
FIG. 5 schematically depicts a top view of a method of copper hillock detecting according to an embodiment of the present invention.
Figure 6:
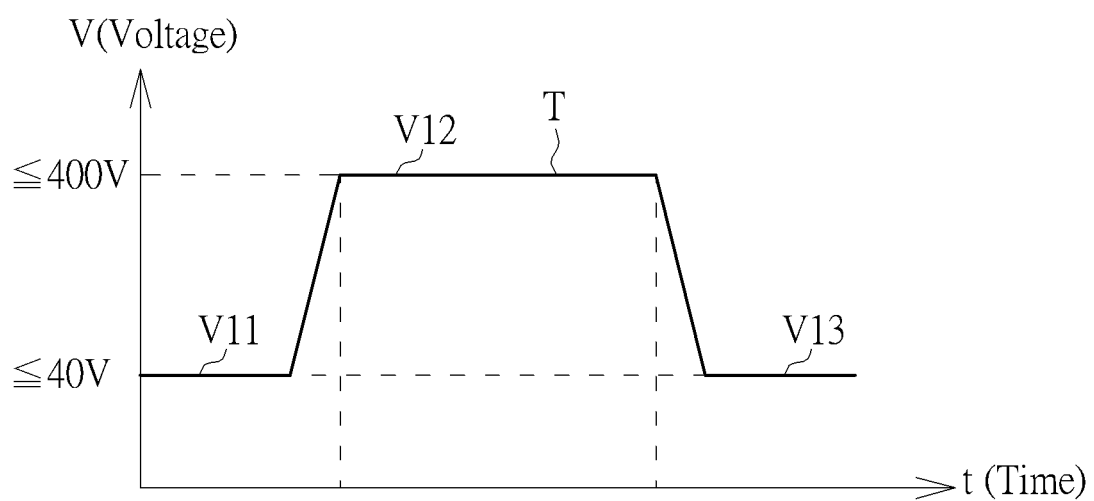
FIG. 6 schematically depicts a voltage versus time chart of a method of copper hillock detecting according to an embodiment of the present invention.

According to step S2 of FIG. 8—applying a force voltage difference to the lower metallization layer and the upper metallization layer under a test temperature and stress time, a method of copper hillock detecting is presented as follows. FIG. 5 schematically depicts a top view of a method of copper hillock detecting according to an embodiment of the present invention. FIG. 6 schematically depicts a voltage versus time chart of a method of copper hillock detecting according to an embodiment of the present invention. Please refer to FIG. 5 and FIG. 6, the testkey structure 220 of FIG. 2 is applied in this embodiment, but it is not limited thereto.

A force voltage difference V1–G to the lower metallization layer 222 and the upper metallization layer 224 is applied under a test temperature T and stress time t. Preferably, the second metal lines 224a/224b/224c/224d are connected to a common voltage V1 while the first metal lines 222a/222b/222c/222d are connected to ground G. In a preferred embodiment, the force voltage difference V1–G is at a range of 0-400V, the test temperature is at a range of 25-300 t, and the stress time is at a range of 0.001-60 s. Ina still preferred embodiment, the force voltage difference includes a three-step voltage of a first step voltage V11, a second step voltage V12 and a third step voltage V13, wherein the second step voltage V12 is higher than the first step voltage V11 and the third step voltage V13, but the present invention is not restricted thereto. In one case, the first step voltage V11 and the third step voltage V13 is 40V, and the second step voltage V12 is 400V.

Figure 7:
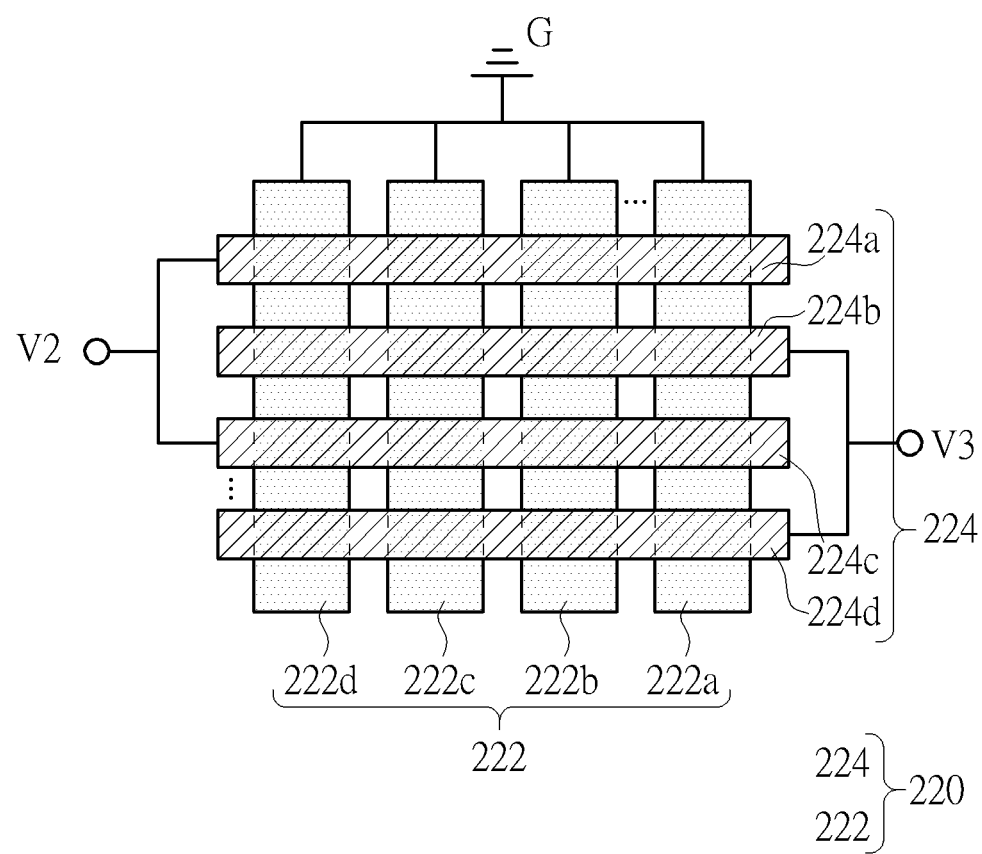
FIG. 7 schematically depicts a top view of a method of copper hillock detecting according to an embodiment of the present invention.

Moreover, another method of copper hillock detecting is provided. FIG. 7 schematically depicts a top view of a method of copper hillock detecting according to an embodiment of the present invention. The voltage versus time chart of FIG. 6 still can be applied in this embodiment. Please refer to FIG. 7 and FIG. 6, the testkey structure 220 of FIG. 2 is also applied in this embodiment, but it is not limited thereto.

In this embodiment, a part of the second metal lines 224a/224c are connected to a first voltage V2, the other part of the second metal lines 224b/224d are connected to a second voltage V3, and the first metal lines 222a/222b/222c/222d are connected to ground G. Thus, a force voltage difference V2-G to the lower metallization layer 222 and the second metal lines 224a/224c can be applied under the test temperature T and the stress time t as shown in FIG. 6. Or, a force voltage difference V3-G to the lower metallization layer 222 and the second metal lines 224b/224d can be applied under the test temperature T and the stress time t as shown in FIG. 6. Or, a force voltage difference V3–V2 to the second metal lines 224a/224c and the second metal lines 224b/224d can be applied under the test temperature T and the stress time t as shown in FIG. 6. In this case, the second metal lines 224a/224c and the second metal lines 224b/224d are alternatively arranged, but it is not limited thereto.

Then, according to step S3 of FIG. 8—detecting a changed sensing voltage difference to the lower metallization layer and the upper metallization layer for detecting copper hillock, a changed sensing voltage difference of the force voltage difference V1-G of FIG. 5, the force voltage difference V2-G of FIG. 7, the force voltage difference V3-G of FIG. 7, or the force voltage difference V3-V2 of FIG. 7, can be detected for detecting copper hillock.

In the present invention, according to step S4 of FIG. 8—performing a regular integrated circuit fabricating process on the substrate, a regular integrated circuit fabricating process is performed on the substrate 110 after the changed sensing voltage difference of the force voltage difference V1-G/V2-G/V3-G/V3-V2 is detected. According to step S5 of FIG. 8—processing a mass production after the changed sensing voltage difference is detected within a pre-determined voltage range, a mass production is processed after the changed sensing voltage difference V1-G/V2-G/V3-G/V3-V2 is detected within a pre-determined voltage range. Or, according to step S6 of FIG. 8—optimizing the regular integrated circuit fabricating process after the changed sensing voltage difference is detected out of a pre-determined voltage range, the regular integrated circuit fabricating process is optimized after the changed sensing voltage difference V1-G/V2-G/V3-G/V3-V2 is detected out of a pre-determined voltage range.

To summarize, the present invention provides a method of copper hillock detecting, which disposes a testkey structure including a lower metallization layer, an upper metallization layer, and a dielectric layer between the lower metallization layer and the upper metallization layer on a substrate, applies a force voltage difference to the lower metallization layer and the upper metallization layer under a test temperature and stress time, and detects a changed sensing voltage difference to the lower metallization layer and the upper metallization layer for detecting copper hillock. Therefore, copper hillock between the lower metallization layer and the upper metallization layer, or between metal lines of the lower metallization layer or between metal lines of the upper metallization layer can be detected before mass production is processed.

Preferably, the force voltage difference is at a range of 0-400V, the test temperature is at a range of 25-300° C., and the stress time is at a range of 0.001-60 s. Still preferably, the force voltage difference includes a three-step voltage of a first step voltage, a second step voltage and a third step voltage, wherein the second step voltage is higher than the first step voltage and the third step voltage.

The lower metallization layer includes a plurality of first metal lines parallel to each other, and the upper metallization layer includes a plurality of second metal lines parallel to each other, wherein the first metal lines and the second metal lines may be crossly arranged or extend along a same direction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of copper hillock detecting, comprising:
    disposing a testkey structure on a substrate, wherein the testkey structure comprises:
        a lower metallization layer, an upper metallization layer, and a dielectric layer between the lower metallization layer and the upper metallization layer, wherein the lower metallization layer comprises a plurality of first metal lines parallel to each other, and the upper metallization layer comprises a plurality of second metal lines parallel to each other;
    applying a force voltage difference to the lower metallization layer and the upper metallization layer under a test temperature and stress time, wherein a part of the second metal lines are connected to a first voltage, the other part of the second metal lines are connected to a second voltage, and the first metal lines are connected to ground; and
    detecting a changed sensing voltage difference to the lower metallization layer and the upper metallization layer for detecting copper hillock.

2. The method of copper hillock detecting according to claim 1, wherein the testkey structure is disposed in a scribe line of the substrate.

3. The method of copper hillock detecting according to claim 1, further comprising:
    performing a regular integrated circuit fabricating process on the substrate.

4. The method of copper hillock detecting according to claim 3, further comprising:
    processing a mass production after the changed sensing voltage difference is detected within a pre-determined voltage range.

5. The method of copper hillock detecting according to claim 3, further comprising:
    optimizing the regular integrated circuit fabricating process after the changed sensing voltage difference is detected out of a pre-determined voltage range.

6. The method of copper hillock detecting according to claim 1, wherein the force voltage difference is at a range of 0-400V.

7. The method of copper hillock detecting according to claim 1, wherein the test temperature is at a range of 25-300° C.

8. The method of copper hillock detecting according to claim 1, wherein the stress time is at a range of 0.001-60 s.

9. The method of copper hillock detecting according to claim 1, wherein the force voltage difference comprises a three-step voltage of a first step voltage, a second step voltage and a third step voltage.

10. The method of copper hillock detecting according to claim 9, wherein the second step voltage is higher than the first step voltage and the third step voltage.

11. The method of copper hillock detecting according to claim 10, wherein the first step voltage and the third step voltage is 40V, and the second step voltage is 400V.

12. The method of copper hillock detecting according to claim 1, wherein the first metal lines and the second metal lines are crossly arranged.

13. The method of copper hillock detecting according to claim 1, wherein the first metal lines and the second metal lines extend along a same direction.

14. The method of copper hillock detecting according to claim 13, wherein the second metal lines vertically overlap the first metal lines.

15. The method of copper hillock detecting according to claim 1, wherein the part of the second metal lines and the other part of the second metal lines are alternatively arranged.

* * * * *